United States Patent
Fang et al.

(10) Patent No.: US 10,971,556 B1
(45) Date of Patent: Apr. 6, 2021

(54) ORGANIC LIGHT-EMITTING DISPLAY PANEL AND ORGANIC LIGHT-EMITTING DISPLAY DEVICE

(71) Applicant: Shanghai Tianma AM-OLED Co., Ltd., Shanghai (CN)

(72) Inventors: Yueting Fang, Shanghai (CN); Yue Li, Shanghai (CN); Huiping Chai, Shanghai (CN); Lijing Han, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/833,134

(22) Filed: Mar. 27, 2020

(30) Foreign Application Priority Data

Dec. 30, 2019 (CN) .......................... 201911398966.4

(51) Int. Cl.
*G09G 3/32* (2016.01)
*H01L 27/32* (2006.01)
*G09G 3/3233* (2016.01)
*G09G 3/20* (2006.01)

(52) U.S. Cl.
CPC ....... *H01L 27/3218* (2013.01); *G09G 3/2003* (2013.01); *G09G 3/3233* (2013.01); *H01L 27/3216* (2013.01); *H01L 27/3276* (2013.01); *G09G 2300/0452* (2013.01); *G09G 2320/0242* (2013.01)

(58) Field of Classification Search
CPC .. G09G 3/32; G09G 3/30; G09G 3/34; G09G 3/36; G09G 5/00; G06F 3/038
See application file for complete search history.

(56) References Cited

U.S. PATENT DOCUMENTS

| | | | |
|---|---|---|---|
| 2007/0097072 A1* | 5/2007 | Kim | G09G 3/3659 345/103 |
| 2010/0156954 A1* | 6/2010 | Kim | G09G 3/3614 345/690 |
| 2011/0141386 A1* | 6/2011 | Kira | G02F 1/133514 349/41 |
| 2017/0285421 A1* | 10/2017 | Tsuruma | H01L 29/78675 |
| 2020/0142265 A1* | 5/2020 | Zhao | G02F 1/134336 |

FOREIGN PATENT DOCUMENTS

| CN | 107204352 A | 9/2017 |
|---|---|---|
| CN | 104659061 B | 2/2019 |

* cited by examiner

*Primary Examiner* — Pegeman Karimi
(74) *Attorney, Agent, or Firm* — Alston & Bird LLP (57) ABSTRACT

An organic light-emitting display panel includes: pixel rows arranged sequentially along a first direction and high voltage signal lines extending along the first direction. Each pixel row includes pixel sets arranged along a second direction which intersects the first direction. Each pixel set includes first and second pixels arranged along the second direction. The first pixel includes first to third sub-pixels emitting different colors. The second pixel includes fourth to sixth sub-pixels emitting different colors. Each sub-pixel includes a pixel driving circuit and an organic light-emitting diode. The high voltage signal lines are electrically connected to the sub-pixels, so as to provide voltage signals to anodes of the organic light-emitting diodes for driving the sub-pixels to emit light. For the same pixel set, the third and fourth sub-pixels have the same color, and are electrically connected to the same third high voltage signal line.

20 Claims, 7 Drawing Sheets

FIG. 1

(Prior Art)

ORGANIC LIGHT-EMITTING DISPLAY PANEL AND ORGANIC LIGHT-EMITTING DISPLAY DEVICE

CROSS-REFERENCE TO RELATED APPLICATIONS

The present application claims the benefit of priority to Chinese Patent Application No. CN201911398966.4, filed on Dec. 30, 2019, the content of which is incorporated herein by reference in its entirety.

TECHNICAL FIELD

The present disclosure relates to the field of display technologies, and in particular, to an organic light-emitting display panel and an organic light-emitting display device.

BACKGROUND

Currently, an organic light-emitting diode (OLED) is one of research hotspots in the field of flat panel display.

In the related arts, an organic light-emitting display panel typically includes a red sub-pixel, a green sub-pixel, a blue sub-pixel, and a power supply line. The power supply line is configured to transmit a power signal to a sub-pixel to drive a sub-pixel to emit light. Due to a voltage drop phenomenon existing in the PVDD power supply line, sub-pixels at different positions might get different voltages. In this case, under the same data signal voltage input, sub-pixels at different positions would output different brightness. As a result, a color shift phenomenon may occur in some areas of the organic light-emitting display panel, which would reduce a display quality.

Especially for a display panel having a large dimension, the color shift phenomenon is more serious. An obvious color difference exists between a proximal IC end and a distal IC end of the display panel, seriously reducing display quality and affecting user experience.

SUMMARY

In view of this, the embodiments of the present disclosure provide an organic light-emitting display panel and an organic light-emitting display device, aiming to solve the problems mentioned in the related art.

In an aspect, an embodiment of the present disclosure provides an organic light-emitting display panel having a display area. The organic light-emitting display panel includes: a plurality of pixel rows disposed sequentially along a first direction in the display area, wherein each pixel row of the plurality of pixel rows includes a plurality of pixel sets arranged along a second direction, wherein the second direction intersects the first direction; wherein each pixel set of the plurality of pixel sets includes a first pixel and a second pixel arranged along the second direction; and a plurality of high voltage signal lines extending along the first direction. The first pixel includes a first sub-pixel, a second sub-pixel, and a third sub-pixel emitting different colors, and the second pixel includes a fourth sub-pixel, a fifth sub-pixel, and a sixth sub-pixel emitting different colors. Each of the first to sixth sub-pixels includes a pixel driving circuit and an organic light-emitting diode. The plurality of high voltage signal lines is electrically connected to the first to sixth sub-pixels, so as to provide voltage signals to anodes of the organic light-emitting diodes of the first to sixth sub-pixels for driving the first to sixth sub-pixels to emit light. The plurality of high voltage signal lines includes a third high voltage signal line. The third sub-pixel and the fourth sub-pixel in a same said pixel set are electrically connected to a same third high voltage signal line and emit a same color.

In another aspect, an embodiment of the present disclosure provides an organic light-emitting display device, including the organic light-emitting display panel provided by the embodiment of the present disclosure.

In the organic light-emitting display panel and the organic light-emitting display device provided in the embodiments of the present disclosure, the pixel row includes a plurality of pixel sets arranged along the second direction, and the pixel set includes a first pixel and a second pixel arranged along the second direction. For a same pixel set, the third sub-pixel and the fourth sub-pixel have a same color, and the third sub-pixel and the fourth sub-pixel are electrically connected to a same third high voltage signal line. In the case where the cross-sectional area and the length of the high voltage signal line are not changed compared with the related art, the number of sub-pixels electrically connected to the third high voltage signal line is increased, that is, the load of the third high voltage signal line is increased, which is equivalent to that the equivalent resistance of the third high voltage signal line is increased. It is known that the larger resistance of the signal line leads to the more obvious IP drop phenomenon. Therefore, in this embodiment, the IP drop ($\delta V$) of the third high voltage signal line is increased, that is, the current change $\delta I_3$ of the third sub-pixel SP3 and the fourth sub-pixel SP4 electrically connected to the third high voltage signal line is increased, so that it is close to or substantially the same as the current change $\delta I_1$ of other sub-pixel. Therefore, compared with the related art, the organic light-emitting display panel provided in the present disclosure can make the current change $\delta I_3$ of the third sub-pixel and the fourth sub-pixel be the same or substantially the same as that of other sub-pixel. Therefore, regardless at the proximal IC end or at the dismal IC end, the current change of each sub-pixel is the same or substantially the same, thereby alleviating the color shift phenomenon of the organic light-emitting display panel at the proximal IC end and at the dismal IC end in the related art. In this way, the display quality can be improved, thereby improving the user experience.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, other drawings can also be acquired by those skilled in the art without paying creative efforts.

REFERENCE NUMERALS IN THESE FIGURES ARE LISTED BELOW

AA: display area;
X: first direction;
Y: second direction;
L: pixel row;
PZ: pixel set;
P1: first pixel;
P2: second pixel;
SP1: first sub-pixel;
SP2: second sub-pixel;
SP3: third sub-pixel;
SP4: fourth sub-pixel;
SP5: fifth sub-pixel;
SP6: sixth sub-pixel;
OLED: organic light-emitting diode;
PVDD: high voltage signal line;
PVDD1: first high voltage signal line;
PVDD2: second high voltage signal line;
PVDD3: third high voltage signal line;
PVDD5: fifth high voltage signal line;
PVDD6: sixth high voltage signal line;
A1: first sub-area; and
A2: second sub-area.

DESCRIPTION OF EMBODIMENTS

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

In the description of this specification, it should be understood that the terms "substantially", "basically" "approximately", "about", "almost" and "roughly" described in the claims and embodiments of the present disclosure indicates a value that can be generally agreed within a reasonable process operation range or tolerance range, rather than an exact value.

Figure 1:
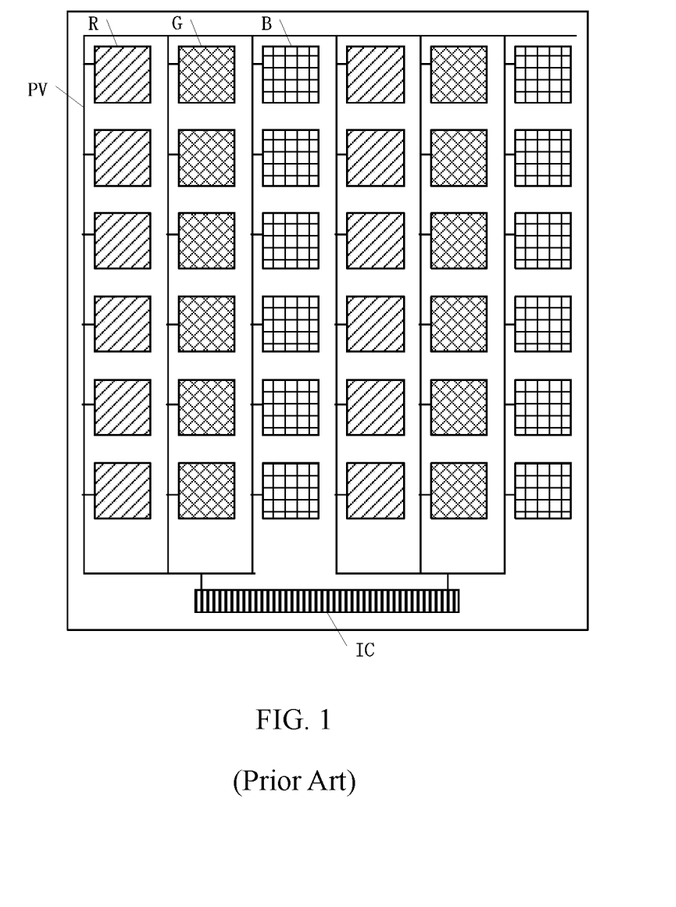
FIG. 1 is a schematic structural diagram of an organic light-emitting display panel in the related arts.

FIG. 1 is a schematic diagram of a structure of an organic light-emitting display panel in the related arts. With reference to FIG. 1, which shows the following features in the related arts to solve the color shift problem of the display panel.

An organic light-emitting display panel in the related art includes a red sub-pixel R, a green sub-pixel G, a blue sub-pixel B, and a power supply line PV. The sub-pixels emitting different colors require light-emitting currents having different magnitudes. For convenience, color emitting pixels are called color pixels, such as blue pixel is a pixel emitting blue color. For example, the blue sub-pixel B requires for a light-emitting current having a larger magnitude, while the red sub-pixel R and the green sub-pixel G require for light-emitting currents having smaller magnitudes. According to an I-V characteristic curve of a transistor, under a same voltage drop $\delta V$, a current change $\delta I'$ of the blue sub-pixel of a larger current is smaller, while a current change $\delta I''$ of the red sub-pixel and a current change $\delta I'''$ of the green sub-pixel are larger. In order to balance a color of an entire panel, at a proximal IC end of the display panel, a proportion of the light-emitting current of the blue sub-pixel is set to be lower, and the display panel renders a relatively red color in this area; and at a dismal IC end of the display panel, since the current change of the blue sub-pixel is smaller and accordingly a proportion of the light-emitting current is higher, the display panel renders a relatively blue color in this area.

With the increasing requirements for display devices, the existing display devices are made into larger screens. For example, dimensions of a terminal display device such as a mobile phone displayer or a vehicle-mounted displayer are becoming larger and larger. For a panel having a large dimension, the phenomenon that the display panel renders relatively red at the proximal IC end and relatively blue at the dismal IC end is more obvious from powering voltages, which seriously reduces the display quality and affects the user experience.

Therefore, embodiments of the present disclosure provide an organic light-emitting display panel and an organic light-emitting display device, which can solve the problem that the display panel is relatively red at the proximal IC end and relatively blue at the dismal IC end. The embodiments are described in the following for illustration.

Figure 2:
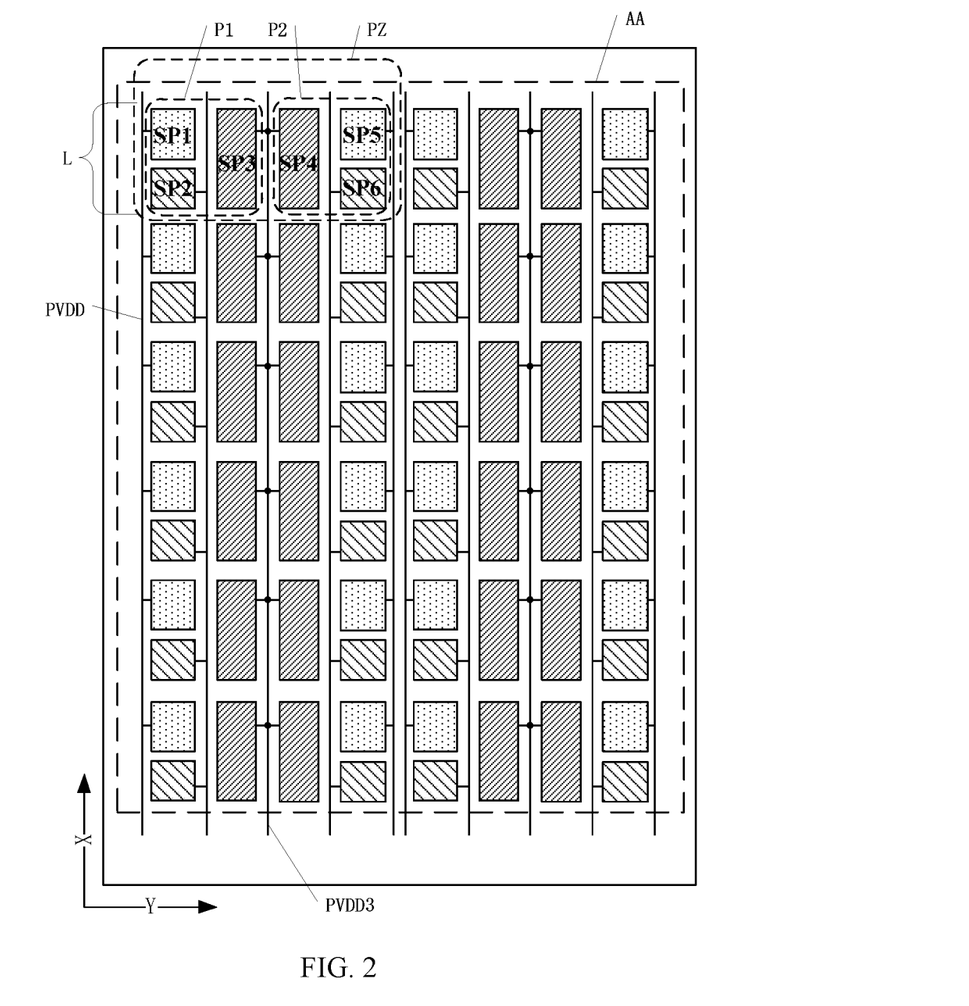
FIG. 2 is a schematic structural diagram of an organic light-emitting display panel, according to an embodiment of the present disclosure.
Figure 3:
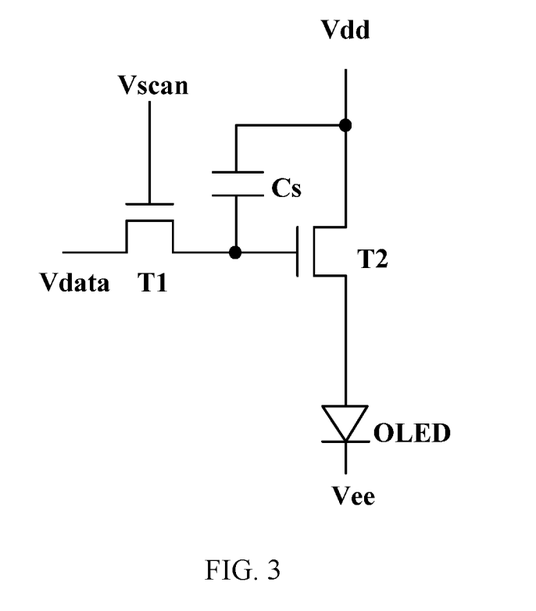
FIG. 3 is a schematic diagram of a pixel circuit, according to an embodiment of the present disclosure.

FIG. 2 is a schematic structural diagram of an organic light-emitting display panel, according to an embodiment of the present disclosure, and FIG. 3 is a schematic diagram of a pixel circuit, according to an embodiment of the present disclosure.

With reference to FIG. 2 and FIG. 3, the present embodiment provides an organic light-emitting display panel having a display area AA. The display area AA is provided with a plurality of pixel rows L arranged sequentially along a first direction X, and each pixel row L includes a plurality of repeating pixel sets PZ arranged along a second direction Y.

Each pixel set PZ includes a first pixel P1 and a second pixel P2 arranged along the second direction Y.

The first pixel P1 includes a first sub-pixel SP1, a second sub-pixel SP2, and a third sub-pixel SP3 that have different colors; and the second pixel P2 includes a fourth sub-pixel SP4, a fifth sub-pixel SP5, and a sixth sub-pixel SP6 that have different colors.

The sub-pixel includes a pixel driving circuit and an organic light-emitting diode OLED. The display area AA is provided with a plurality of high voltage signal lines PVDD extending along the first direction X, and the high voltage signal lines PVDD are electrically connected to the sub-pixels, so as to provide voltage signals to anodes of the organic light-emitting diodes OLED of the sub-pixels to drive the sub-pixels to emit light.

For a same pixel set PZ, the third sub-pixel SP3 and the fourth sub-pixel SP4 have a same color, and the third sub-pixel SP3 and the fourth sub-pixel SP4 are electrically connected to a same third high voltage signal line PVDD3.

The first direction X intersects the second direction Y.

For the organic light-emitting display panel according to this embodiment, the display area AA has a function of displaying image information, and is provided with a plurality of pixel rows L arranged sequentially along the first direction X. It can be understood that a number of pixel rows L shown in FIG. 2 shall not be construed as a limitation to the present disclosure. In an actual implementation, the number of pixel rows L can be set according to actual facts. When the organic light-emitting display panel has a fixed dimension, the larger number of pixel rows L usually leads to the higher resolution of the organic light-emitting display panel and the finer image that is displayed.

The pixel row L includes a plurality of repeating pixel sets PZ arranged along the second direction Y. It should be noted that other pixel structure may or may not be provided between two adjacent pixel sets PZ, which will not be limited by the present disclosure. The pixel set PZ includes the first pixel P1 and the second pixel P2 arranged along the second direction Y. It should be noted that the first pixel P1 and the second pixel P2 are adjacent to each other without other pixel structure arranged therebetween.

The colors of the three sub-pixels of the first pixel P1 are different from each other. For example, the colors of the three sub-pixels of the first pixel P1 are red, green, and blue, respectively. The three sub-pixels emitting different colors can perform color mixing, so as to display multiple different colors. The more colors that can be displayed after color mixing of the three sub-pixels of the first pixel P1 lead to the richer colors of an image that can be displayed by the organic light-emitting display panel. Similarly, the colors of the three sub-pixels of the second pixel P2 are different from each other. For example, the colors of the three sub-pixels of the second pixel P2 are red, green, and blue, respectively.

The sub-pixel include a pixel driving circuit and an organic light-emitting diode OLED. It should be noted that FIG. 3 schematically illustrates a circuit diagram of a pixel driving circuit. A working principle will be described as follows. In the sub-pixel, the organic light-emitting diode OLED includes an anode that receives a high-voltage signal Vdd and a cathode that receives a low-voltage signal Vee. The high voltage signal Vdd is provided by the high voltage signal line PVDD. When a gate signal Vscan is inputted to a gate line to which the sub-pixel is electrically connected, the gate signal Vscan drives the switch T1 to be turned on, a data voltage Vdata charges a storage capacitor Cs through the switch T1. A voltage of the storage capacitor Cs controls a driving switch T2 to be turned on, and the high-voltage signal Vdd is transmitted to the driving switch T2 to generate a driving current for driving the organic light-emitting diode OLED to emit light.

It should be understand by those skilled in the art that each sub-pixel can be provided with one pixel driving circuit, or two sub-pixels can share a partial circuit structure of one pixel driving circuit, which will not be limited in the embodiments of the present disclosure.

It should be noted that FIG. 3 only schematically illustrates the working principle of the pixel driving circuit. It should be understand by those skilled in the art that there are various structures of the pixel driving circuit in the prior art, which will not be described one by one in the present disclosure.

In a same pixel set PZ, the third sub-pixel SP3 and the fourth sub-pixel SP4 are electrically connected to a same third high voltage signal line PVDD3. The high voltage signal provided by the third high voltage signal line PVDD3 is used to drive the third sub-pixel SP3 and the fourth sub-pixel SP4 to emit light.

In an example, the third sub-pixel SP3 and the fourth sub-pixel SP4 in the pixel set PZ located in a same column along the first direction X are both electrically connected to a same third high voltage signal line PVDD3.

In a case where a cross-sectional area and a length of the high voltage signal line are not changed compared with the related art, since a number of sub-pixels electrically connected to the third high voltage signal line PVDD3 is increased, that is, a load of the third high voltage signal line PVDD3 is increased, this is equivalent to that an equivalent resistance of the third high voltage signal line PVDD3 is increased. It is known that the larger resistance of the signal line leads to the more obvious IP drop phenomenon. Therefore, in this embodiment, the IP drop (W) of the third high voltage signal line PVDD3 is increased, that is, the current change $\delta I_3$ of the third sub-pixel SP3 and the fourth sub-pixel SP4 electrically connected to the third high voltage signal line PVDD3 is increased, so that it is close to or substantially the same as the current change $\delta I_1$ of other sub-pixel. Therefore, compared with the related art, the organic light-emitting display panel provided in the present disclosure can make the current change $\delta I_3$ of the third sub-pixel and the fourth sub-pixel be the same or substantially the same as that of other sub-pixel. Therefore, regardless at the proximal IC end or at the dismal IC end, the current change of each sub-pixel is the same or substantially the same, thereby alleviating the color shift phenomenon of the organic light-emitting display panel at the proximal IC end and at the dismal IC end in the related art. In this way, the display quality can be improved, thereby improving the user experience.

It should be noted that in this embodiment of the present disclosure, the first direction X intersects the second direction Y. In an example, the first direction X may be perpendicular or substantially perpendicular to the second direction Y.

With further reference to FIG. 2 and FIG. 3, in some embodiments, one of the first sub-pixel SP1 and the second sub-pixel SP2 is a red sub-pixel, the other one is a green sub-pixel; one of the fifth sub-pixel SP5 and the sixth sub-pixel SP6 is a red sub-pixel, and the other one is a green sub-pixel; and both the third sub-pixel SP3 and the fourth sub-pixel SP4 are blue sub-pixels. In the organic light-emitting display panel provided in this embodiment, the colors of the three sub-pixels of the first pixel P1 are red, green, and blue, respectively, and the colors of the three sub-pixels of the second pixel P2 are red, green, and blue, respectively. The three colors are three primary colors of light, and all colors can be obtained by mixing the three colors. Therefore, the organic light-emitting display panel can achieve rich colors and high display quality.

As limited in the related art, when the red, green, and blue sub-pixels display a same brightness, the three sub-pixels correspond to different light-emitting currents. The light-emitting current of the red sub-pixel and the light-emitting current of the green sub-pixel are smaller than the light-emitting current of the blue sub-pixel. The light-emitting current of the red sub-pixel and the light-emitting current of the green sub-pixel are usually approximately ½ of the light-emitting current of the blue sub-pixel.

In the case where the cross-sectional area and the length of the high voltage signal line are not changed compared with the related art, since the number of sub-pixels electrically connected to the third high voltage signal line PVDD3 is increased, that is, the load of the third high voltage signal line PVDD3 is increased, this is equivalent to that the equivalent resistance of the third high voltage signal line PVDD3 is increased. It is known that the larger resistance of the signal line leads to the more obvious IP drop phenomenon. Thus, in this embodiment, the IP drop ($\delta V$) of the third high voltage signal line PVDD3 is increased, that is, the current change $\delta I_3$ of the blue pixels electrically connected to the third high voltage signal line PVDD3 is increased, so that it is close to or substantially the same as the current change $\delta I_1$ of the red sub-pixel and the current change $\delta I_2$ of the green sub-pixel. Therefore, compared with the related art, the organic light-emitting display panel provided in the present disclosure can make the current change of the blue sub-pixel, the current change of the red sub-pixel and the current change of the green sub-pixel be the same or substantially the same. Therefore, the phenomenon that the organic light-emitting display panel is relatively red at the proximal IC end and is relatively blue at the dismal IC end can be alleviated, thereby improving the display quality and thus improving the user experience.

It should be noted that, in the organic light-emitting display panel provided in this embodiment of the present disclosure, there may be various arrangements of pixels. In the following, the present disclosure provides some exemplary arrangements of pixels.

With further reference to FIG. 2, in some embodiments of arrangements of pixels, the third sub-pixel SP3 and the fourth sub-pixel SP4 are mirror symmetrical to each other about the third high voltage signal line PVDD3. In this embodiment, the third sub-pixel SP3 and the fourth sub-pixel SP4 are mirror symmetrical to each other, that is, the two have a same dimension.

With further reference to FIG. 2, in some other embodiments of arrangements of pixels, the first pixel P1 and the second pixel P2 are mirror symmetrical to each other about the third high voltage signal line PVDD3. With the third high voltage signal line PVDD3 as the symmetry axis, the first sub-pixel SP1 and the fifth sub-pixel SP5 are mirror symmetrical to each other and have a same dimension, and the second sub-pixel SP2 and the sixth sub-pixel SP6 are mirror symmetrical to each other and have a same dimension. In this embodiment, the first pixel P1 and the second pixel P2 are mirror symmetrical to each other, which facilitates a uniform arrangement of pixels in the display area and an arrangement of signal lines, thereby improving the display quality.

Figure 5:
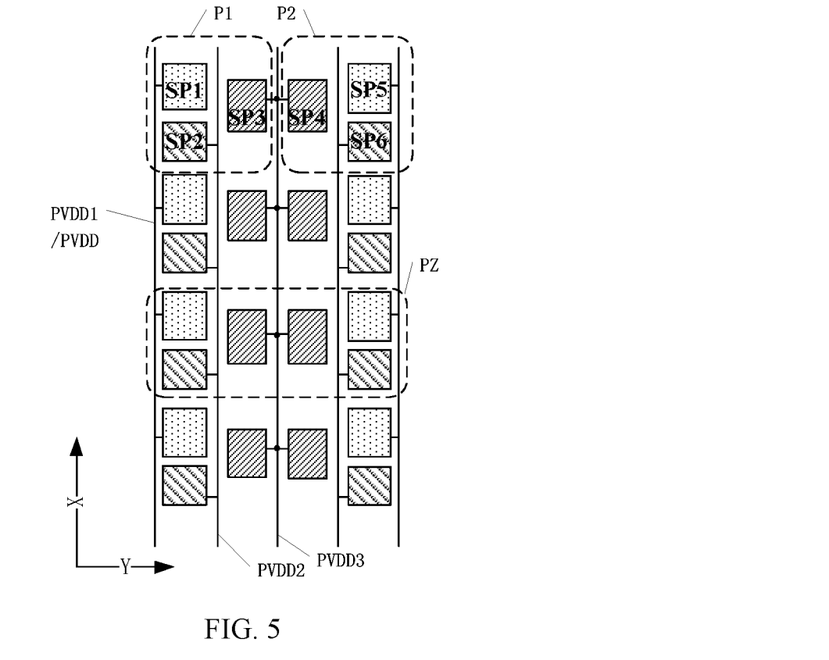
FIG. 5 is a portion of the diagram of another organic light-emitting display panel, according to an embodiment of the present disclosure.

FIG. 5 is a schematic diagram of a structure of a portion of still another organic light-emitting display panel according to an embodiment of the present disclosure.

With reference top FIG. 5, in some embodiments of arrangements of pixels, for a same pixel set, the first sub-pixel SP1, the second sub-pixel SP2, and the third sub-pixel SP3 are arranged in a triangle. In an example, a length of the first sub-pixel SP1, a length of the second sub-pixel SP2, and a length of the third sub-pixel SP3 in the first direction X are substantially the same. In an example, a sum of the length of the first sub-pixel SP1 and the length of the second sub-pixel SP2 in the first direction X is larger than the length of the third sub-pixel SP3 in the first direction X.

The triangle arrangement in this embodiment can be understood as follows: lines connecting center points of opening areas of the first sub-pixel SP1, the second sub-pixel SP2, and the third sub-pixel SP3 of the first pixel P1 can form a triangle.

In an example, the first pixel P1 and the second pixel P2 are mirror symmetrical to each other, and then the fourth sub-pixel SP4, the fifth sub-pixel SP5, and the sixth sub-pixel SP6 of the second pixel P2 are also arranged in a triangle.

In some embodiments, with further reference to FIG. 5, the first sub-pixels SP1 and the second sub-pixels SP2 are alternately arranged along the first direction X, and the third sub-pixels SP3 are located in a same column along the first direction X. The first sub-pixels SP1 located in a same column along the first direction X are electrically connected to a same high voltage signal line PVDD1. The second sub-pixels SP2 located in a same column along the first direction X are electrically connected to a same high voltage signal line PVDD2. The third sub-pixels SP3 located in a same column along the first direction X are electrically connected to a same third high voltage signal line PVDD3. The fourth sub-pixels SP4 located in a same column along the first direction X are electrically connected to a same third high voltage signal line PVDD3. Moreover, one column of third sub-pixels SP3 and one column of fourth sub-pixels SP4 that are adjacent to each other are electrically to a same high voltage signal line PVDD3. In an example, one of the first sub-pixel SP1 and the second sub-pixel SP2 is a red sub-pixel, and the other one is a green sub-pixel; and the third sub-pixel SP3 is a blue sub-pixel. Therefore, the phenomenon that the organic light-emitting display panel is relatively red at the proximal IC end and is relatively blue at the dismal IC end can be alleviated, thereby improving the display quality and thus improving the user experience.

With further reference to FIG. 5, in some other embodiments of arrangements of pixels, the first sub-pixel SP1 and the fifth sub-pixel SP5 are located in a same row along the second direction Y and have a same color; the second sub-pixel SP2 and the sixth sub-pixel SP6 are located in a same row along the second direction Y and have a same color.

The sub-pixels being located in a same row can be understood as follows: since an actual area of each sub-pixel is very small, the sub-pixel can be abstracted into a "point", a line connecting center points of the opening area of the first sub-pixel SP1 and the opening area of the fifth sub-pixel SP5 is parallel to the second direction Y; and similarly, a line connecting center points of the opening area of the second sub-pixel SP2 and the opening area of the sixth sub-pixel SP6 is parallel to the second direction Y. In the organic light-emitting display panel provided in this embodiment, the first pixel P1 and the second pixel P2 have sub-pixels emitting a same color, thereby facilitating a uniform arrangement of the pixels in the display area and thus simplifying design of the organic light-emitting display panel.

Figure 4:
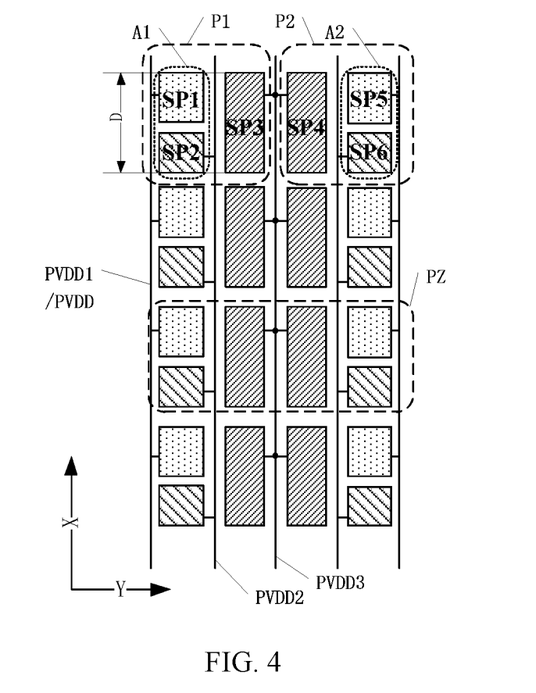
FIG. 4 is a portion of the diagram of another organic light-emitting display panel, according to an embodiment of the present disclosure.

FIG. 4 is a schematic diagram of a structure of a portion of another organic light-emitting display panel according to an embodiment of the present disclosure.

With reference to FIG. 4, in some other embodiments of arrangements of pixels, for a same pixel set, the first sub-pixel SP1 and the second sub-pixel SP2 are arranged along the first direction X; and the third sub-pixel SP3 and a first sub-area A1 where the first sub-pixel SP1 and the second sub-pixel SP2 are located are arranged along the second direction Y.

The fifth sub-pixel SP5 and the sixth sub-pixel SP6 are arranged along the first direction X. The fourth sub-pixel SP4 and a second sub-area A2 where the fifth sub-pixel SP5 and the sixth sub-pixel SP6 are located are arranged along the second direction Y.

With further reference to FIG. 4, in some embodiments, a length from an outer edge of the first sub-pixel SP1 to an outer edge of the second sub-pixel SP2 in the first direction X is identical to a length of the third sub-pixel SP3 in the first direction X, where both the lengths are D.

In some embodiments, with further reference to FIG. 4, the first sub-pixels SP1 and the second sub-pixels SP2 are alternately arranged along the first direction X, and the third sub-pixels SP3 are located in a same column along the first direction X. The first sub-pixels SP1 located in a same column along the first direction X are electrically connected to a same high voltage signal line PVDD1. The second sub-pixels SP2 located in a same column along the first direction X are electrically connected to a same high voltage signal line PVDD2. The third sub-pixels SP3 located in a same column along the first direction X are electrically connected to a same third high voltage signal line PVDD3. The fourth sub-pixels SP4 located in a same column along the first direction X are electrically connected to a same third high voltage signal line PVDD3. In an example, one row of third sub-pixels SP3 and one row of fourth sub-pixels SP4 that are adjacent to each other are electrically connected to a same third high voltage signal line PVDD3. In an example, one of the first sub-pixel SP1 and the second sub-pixel SP2 is a red sub-pixel, and the other one is a green sub-pixel; and the third sub-pixel SP3 is a blue sub-pixel. Therefore, the phenomenon that the organic light-emitting display panel is relatively red at the proximal IC end and is relatively blue at the dismal IC end can be alleviated, thereby improving the display quality and thus improving the user experience.

Figure 6:
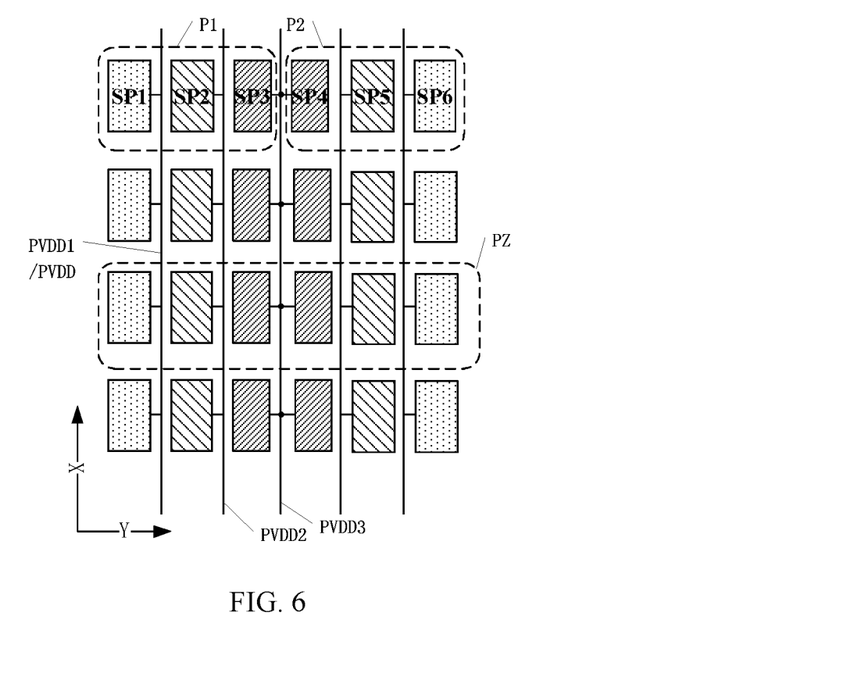
FIG. 6 is a portion of the diagram of another organic light-emitting display panel, according to an embodiment of the present disclosure.

FIG. 6 is a schematic diagram of a structure of a portion of still another organic light-emitting display panel according to an embodiment of the present disclosure.

With reference to FIG. 6, in some other embodiments of arrangements of pixels, for a same pixel set, the first sub-pixel SP1, the second sub-pixel SP2 and the third sub-pixel SP3 are arranged along the second direction Y; and the fourth sub-pixel SP4, the fifth sub-pixel SP5, and the sixth sub-pixel SP6 are arranged along the second direction Y.

This embodiment provides another implementation manner of arrangements of pixels, in which the three sub-pixels of the first pixel P1 may have a same area or different areas. In an example, the first sub-pixel SP1, the second sub-pixel SP2, and the third sub-pixel SP3 have a same length along the first direction X, and do not have an exactly same width along the second direction.

In some embodiments, with further reference to FIG. 6, the first sub-pixels SP1 and the second sub-pixels SP2 are alternately arranged along the first direction X; and the third sub-pixels SP3 are located in a same column along the first direction X. The first sub-pixels SP1 located in a same column along the first direction X are electrically connected to a same high voltage signal line PVDD1. The second sub-pixels SP2 located in a same column along the first direction X are electrically connected to a same high voltage signal line PVDD2. The third sub-pixels SP3 located in a same column along the first direction X are electrically connected to a same third high voltage signal line PVDD3. The fourth sub-pixels SP4 located in a same column along the first direction X are electrically connected to a same third high voltage signal line PVDD3. In an example, one row of third sub-pixels SP3 and one row of fourth sub-pixels SP4 that are adjacent to each other are electrically connected to a same high voltage signal line PVDD3. In an example, one of the first sub-pixel SP1 and the second sub-pixel SP2 is a red sub-pixel, and the other one is a green sub-pixel; and the third sub-pixel SP3 is a blue sub-pixel. Therefore, the phenomenon that the organic light-emitting display panel is relatively red at the proximal IC end and is relatively blue at the dismal IC end can be alleviated, thereby improving the display quality and thus improving the user experience.

Figure 7:
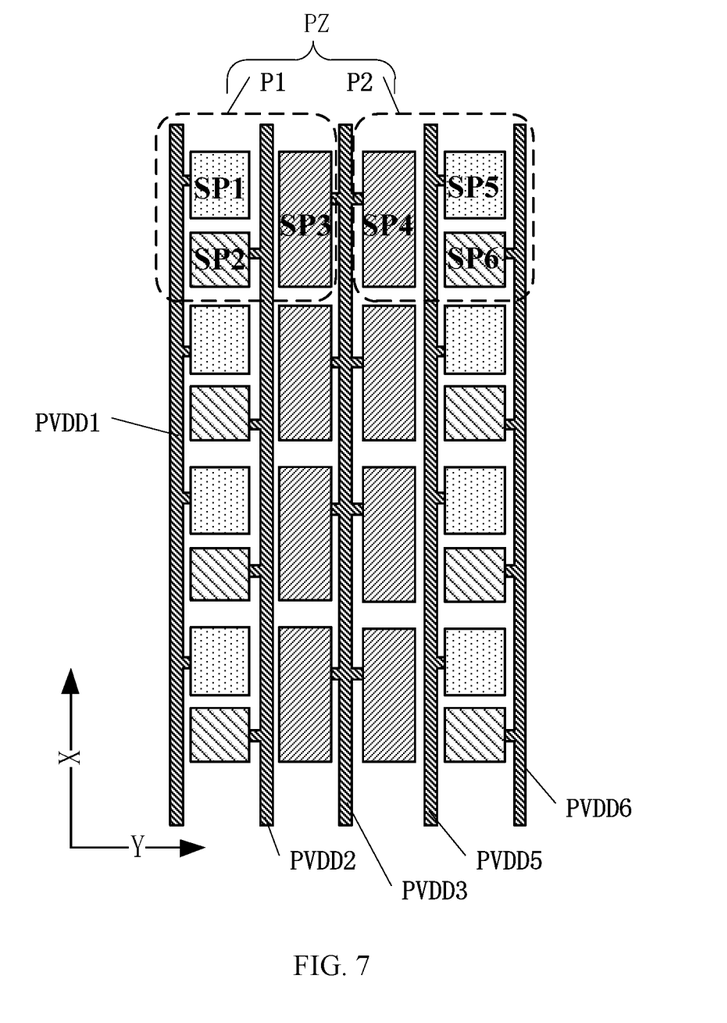
FIG. 7 is a portion of the diagram of another organic light-emitting display panel, according to an embodiment of the present disclosure.

FIG. 7 is a schematic structural diagram of a portion of still another organic light-emitting display panel according to an embodiment of the present disclosure.

With reference to FIG. 7, in this embodiment, the arrangement of pixels is the same as the arrangement of pixels shown in FIG. 4. In a plurality of high voltage signal lines extending along the first direction X, each first high voltage signal line PVDD1 is electrically connected to the first sub-pixels SP1 located in a same column, each second high voltage signal line PVDD2 is electrically connected to the second sub-pixels SP2 located in a same column, each fifth high voltage signal line PVDD5 is electrically connected to the fifth sub-pixels SP5 located in a same column, and each sixth high voltage signal line PVDD6 is electrically connected to the sixth sub-pixel SP6 located in a same column; the third sub-pixels SP3 located in a same column along the first direction X are electrically connected to a same third high voltage signal line PVDD3, and the fourth sub-pixels SP4 located in a same column along the first direction X are electrically connected to a same third high voltage signal line PVDD3; and one row of third sub-pixels SP3 and one row of fourth sub-pixels SP4 that are adjacent to each other are electrically connected to a same third high voltage signal line PVDD3. In an example, one of the first sub-pixel SP1 and the second sub-pixel SP2 is a red sub-pixel, and the other one is a green sub-pixel; and the third sub-pixel SP3 is a blue sub-pixel. Therefore, the phenomenon that the organic light-emitting display panel is relatively red at the proximal IC end and is relatively blue at the dismal IC end is ameliorated, thereby improving the display quality and thus improving the user experience.

A width of the first high voltage signal line PVDD1 is the same as a width of the fifth high voltage signal line PVDD5, and a width of the second high voltage signal line PVDD2 is the same as a width of the sixth high voltage signal line PVDD6. Here, the width of the high voltage signal line refers to the width of the high voltage signal line along the second direction Y.

In this embodiment, some of the high voltage signal lines have a same width, thereby facilitating uniform and symmetrical distribution of lines in the display area and thus improving the display quality. In an example, the first pixel P1 and the second pixel P2 are mirror symmetrical to each other; the first sub-pixel SP1 and the fifth sub-pixel SP5 are mirror symmetrical to each other and have a same dimension; and the second sub-pixel SP2 and the sixth sub-pixel SP6 are mirror symmetrical to each other and have a same dimension. When the first sub-pixel SP1 and fifth sub-pixel SP5 display the same brightness, a same high voltage signal is required. The width of the first high voltage signal line PVDD1 is the same as the width of the fifth high voltage signal line PVDD5, thereby simplifying signal design of the organic light-emitting display panel. Similarly, the width of the second high voltage signal line PVDD2 is the same as the width of the sixth high voltage signal line PVDD6, thereby facilitating further simplifying the signal design of the organic light-emitting display panel.

In an example, the third high voltage signal line PVDD3, the first high voltage signal line PVDD1, and the second high voltage signal line PVDD2 have a same width. In an example, the first high voltage signal line PVDD1, the fifth high voltage signal line PVDD5, the second high voltage signal line PVDD2, and the sixth high voltage signal line PVDD6 each are connected to a same number of sub-pixels. In an example, a number of sub-pixels electrically connected to the third high voltage signal line PVDD3 is twice a number of sub-pixels electrically connected to the first high voltage signal line PVDD1 and the second high voltage signal line PVDD2. Compared with the related art, the load of the third high voltage signal line PVDD3 is doubled, so that the IR drop of the third high voltage signal line PVDD3 is effectively increased. In an example, one of the first sub-pixel SP1 and the second sub-pixel SP2 is a red sub-pixel, and the other one is a green sub-pixel; and the third sub-pixel SP3 is a blue sub-pixel. The proportion of the light-emitting current of the blue sub-pixel at the proximal IC end of the organic light-emitting display panel is further increased, and the proportion of the light-emitting current of the blue sub-pixel at the dismal IC end of the organic light-emitting display panel is further reduced. Therefore, the phenomenon that the organic light-emitting display panel is relatively red at the proximal IC end and is relatively blue at the dismal IC end can be alleviated, thereby improving the display quality and thus improving the user experience.

It should be noted that in this embodiments of the present disclosure, it is only an example that one of the first sub-pixel SP1 and the second sub-pixel SP2 is a red sub-pixel, and the other one is a green sub-pixel, and the third sub-pixel SP3 is a blue sub-pixel. It should be understood that the first sub-pixel SP1, the second sub-pixel SP2, and the third sub-pixel SP3 may respectively have another color, which will not be limited by the present disclosure. Under a premise of not departing from an idea of the present disclosure, the technical solution provided by the present disclosure can be used to solve the problem of color shift of the organic light-emitting display panel.

Figure 8:
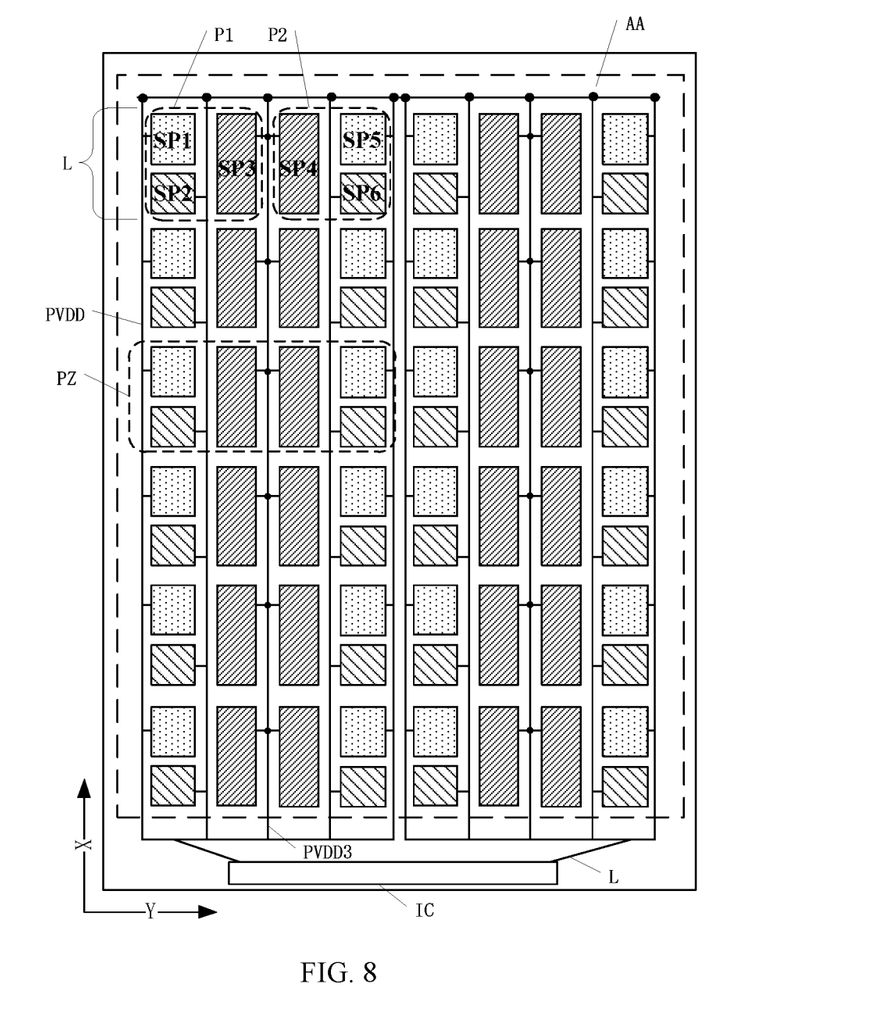
FIG. 8 is a structural diagram of another organic light-emitting display panel, according to an embodiment of the present disclosure.

FIG. 8 is a schematic diagram of a structure of still another organic light-emitting display panel according to an embodiment of the present disclosure. With reference to FIG. 8, in some embodiments, a plurality of high voltage signal lines PVDD extending along the first direction X can be all electrically connected to each other and receive a same electrical signal. In the embodiment shown in FIG. 8, all high voltage signal lines PVDD are electrically connected to each other by a connection line L disposed at the dismal IC end. Such a design can facilitate uniform transmission of a high-voltage signal to each sub-pixel. It should be noted that in other embodiments, a plurality of high voltage signal lines PVDD can also be electrically connected to each other by a connection line disposed at another position, and one or more connection lines can be provided.

In an example, for a same pixel set PZ, the third sub-pixel SP3 and the fourth sub-pixel SP4 have a same color and are adjacent to each other. Here, the adjacent arrangement means that no other sub-pixel is provided between the third sub-pixel SP3 and the fourth sub-pixel SP4. It should be noted that in the drawings of the foregoing embodiments of the present disclosure, it is only an example that the third sub-pixel SP3 and the fourth sub-pixel SP4 electrically connected to a same third high voltage signal line PVDD3 are arranged adjacent to each other, thereby facilitating simplifying a structure of the third high voltage signal line PVDD3 and thus simplifying the design of the organic light-emitting display panel.

Figure 9:
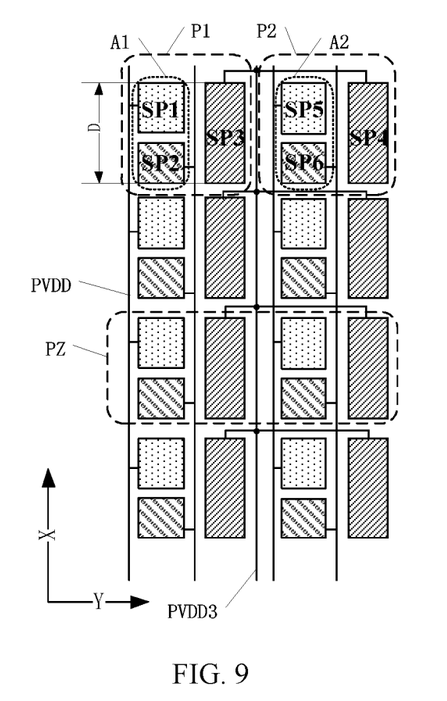
FIG. 9 is a portion of the diagram of another organic light-emitting display panel according to an embodiment of the present disclosure.

It should be understood that in other embodiments of the present disclosure, for example, with reference to FIG. 9, a difference between FIG. 9 and FIG. 4 lies in that for a same pixel set PZ, the third sub-pixel SP3 and the fourth sub-pixel SP4 may not be adjacent to each other, as long as the third sub-pixel SP3 and the fourth sub-pixel SP4 in a same pixel set PZ are electrically connected to a same third high voltage signal line PVDD3. It should be understood by those skilled in the art that there may be various types of arrangements of pixels, which will not be further described one by one with accompanying drawings.

Figure 10:
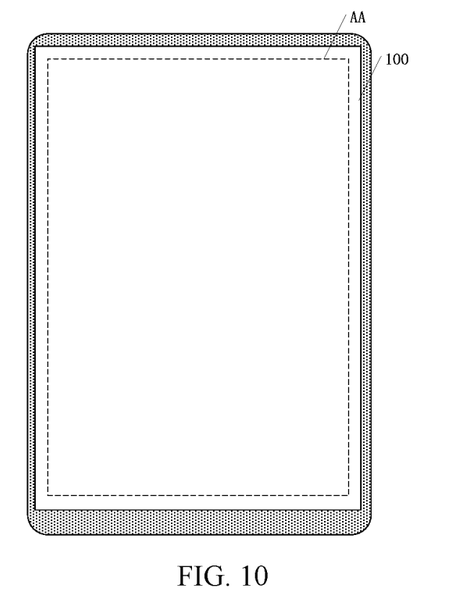
FIG. 10 is a schematic diagram an organic light-emitting display device, according to an embodiment of the present disclosure.

An embodiment of the present disclosure further provides an organic light-emitting display device. As shown in FIG. 10, which is a schematic diagram of a structure of an organic light-emitting display device according to an embodiment of the present disclosure, the organic light-emitting display device includes the organic light-emitting display panel 100 described in the above embodiments. A structure of the organic light-emitting display panel 100 has been described in details in the above embodiments, and will not be further described herein. It should be understood that, the display device shown in FIG. 10 is merely illustrative, and the display device may be, for example, any electronic device having a display function, such as a mobile phone, a tablet computer, a notebook computer, an electronic paper book, a television, a vehicle-mounted center console, and the like.

The organic light-emitting display panel and the organic light-emitting display device provided in the foregoing embodiments of the present disclosure have at least the following beneficial effects.

The pixel row includes a plurality of pixel sets sequentially arranged along the second direction, and the pixel set includes a first pixel and a second pixel arranged along the second direction. For a same pixel set, the third sub-pixel and the fourth sub-pixel have a same color, and the third sub-pixel and the fourth sub-pixel are electrically connected to a same third high voltage signal line. In the case where the cross-sectional area and the length of the high voltage signal line are not changed compared with the related art, the number of sub-pixels electrically connected to the third high voltage signal line is increased, that is, the load of the third high voltage signal line is increased, which is equivalent to that the equivalent resistance of the third high voltage signal line is increased. It is known that the larger resistance of the signal line leads to the more obvious IP drop phenomenon. Therefore, in this embodiment, the IP drop of the third high voltage signal line is increased, so that the proportion of the light-emitting current of the third sub-pixel and the fourth sub-pixel at the proximal IC end of the organic light-emitting display panel is increased, and the proportion of the light-emitting current of the third sub-pixel and the fourth sub-pixel at the dismal IC end of the organic light-emitting display panel is reduced. Therefore, the phenomenon that the organic light-emitting display panel is relatively red at the proximal IC end and is relatively blue at the dismal IC end can be alleviated, thereby improving the display quality and thus improving the user experience.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. An organic light-emitting display panel, the organic light-emitting display panel having a display area, wherein the organic light-emitting display panel comprises:
    a plurality of pixel rows disposed sequentially along a first direction in the display area, wherein each pixel row of the plurality of pixel rows comprises a plurality of pixel sets arranged along a second direction, wherein the second direction intersects the first direction; wherein each pixel set of the plurality of pixel sets comprises a first pixel and a second pixel arranged along the second direction; and
    a plurality of high voltage signal lines extending along the first direction,
    wherein the first pixel comprises a first sub-pixel, a second sub-pixel, and a third sub-pixel emitting different colors, and the second pixel comprises a fourth sub-pixel, a fifth sub-pixel, and a sixth sub-pixel emitting different colors;
    wherein each of the first to sixth sub-pixels comprises a pixel driving circuit and an organic light-emitting diode;
    wherein the plurality of high voltage signal lines is electrically connected to the first to sixth sub-pixels, so as to provide voltage signals to anodes of the organic light-emitting diodes of the first to sixth sub-pixels for driving said first to sixth sub-pixels to emit light, wherein the plurality of high voltage signal lines comprises a third high voltage signal line;
    wherein the third sub-pixel and the fourth sub-pixel in a same said pixel set are electrically connected to a same third high voltage signal line and emit a same color.

2. The organic light-emitting display panel according to claim 1, wherein
    the third sub-pixel and the fourth sub-pixel are mirror symmetrical to each other about said third high voltage signal line.

3. The organic light-emitting display panel according to claim 1, wherein
    the first pixel and the second pixel are mirror symmetrical to each other about said third high voltage signal line.

4. The organic light-emitting display panel according to claim 1, wherein
    the first sub-pixel and the second sub-pixel are arranged along the first direction, and the third sub-pixel and a first sub-area where the first sub-pixel and the second sub-pixel are located are arranged along the second direction; and
    the fifth sub-pixel and the sixth sub-pixel are arranged along the first direction, and the fourth sub-pixel and a second sub-area where the fifth sub-pixel and the sixth sub-pixel are located are arranged along the second direction.

5. The organic light-emitting display panel according to claim 4, wherein
    a length from an outer edge of the first sub-pixel to an outer edge of the second sub-pixel along the first direction is identical to a length of the third sub-pixel along the first direction.

6. The organic light-emitting display panel according to claim 4, wherein
    a center of each of the first sub-pixel, the second sub-pixel, and the third sub-pixel is arranged as a vertex of a triangle.

7. The organic light-emitting display panel according to claim 1, wherein
    the first sub-pixel, the second sub-pixel, and the third sub-pixel are arranged respectively along the second direction; and
    the fourth sub-pixel, the fifth sub-pixel, and the sixth sub-pixel are arranged along the second direction.

8. The organic light-emitting display panel according to claim 1,
    wherein the plurality of high voltage signal lines further comprises a first high voltage signal line electrically connected to the first sub-pixel, a second high voltage signal line electrically connected to the second sub-pixel, a fifth high voltage signal line electrically connected to the fifth sub-pixel, and a sixth high voltage signal line electrically connected to the sixth sub-pixel; and
    wherein a width of the first high voltage signal line along the second direction is identical to a width of the fifth high voltage signal line along the second direction, and a width of the second high voltage signal line along the second direction is identical to a width of the sixth high voltage signal line along the second direction.

9. The organic light-emitting display panel according to claim 8, wherein
    the third high voltage signal line, the first high voltage signal line, and the second high voltage signal line have a same width.

10. The organic light-emitting display panel according to claim 8, wherein
    each of the first high voltage signal line, the fifth high voltage signal line, the second high voltage signal line, and the sixth high voltage signal line is electrically connected to a same number of sub-pixels.

11. The organic light-emitting display panel according to claim 10, wherein
    a number of sub-pixels electrically connected to the third high voltage signal line is twice a number of sub-pixels electrically connected to the first high voltage signal line.

12. The organic light-emitting display panel according to claim 1,
    wherein one of the first sub-pixel and the second sub-pixel is a red sub-pixel, and the other one of the first sub-pixel and the second sub-pixel is a green sub-pixel; and
    wherein both the third sub-pixel and the fourth sub-pixel are blue sub-pixels.

13. The organic light-emitting display panel according to claim 1,
    wherein the first sub-pixel and the fifth sub-pixel are located in a same row along the second direction and have a same color; and
    wherein the second sub-pixel and the sixth sub-pixel are located in a same row along the second direction and have a same color.

14. The organic light-emitting display panel according to claim 1, wherein the third sub-pixel and the fourth sub-pixel in each pixel set of the plurality of the pixel sets located in a same column along the first direction are both electrically connected to a same third high voltage signal line.

15. The organic light-emitting display panel according to claim 1, wherein
the plurality of high voltage signal lines is electrically connected to each other.

16. The organic light-emitting display panel according to claim 1, wherein
for a same pixel set of the plurality of pixel sets, the third sub-pixel and the fourth sub-pixel are adjacent to each other.

17. An organic light-emitting display device, comprising an organic light-emitting display panel, the organic light-emitting display panel having a display area, wherein the organic light-emitting display panel comprises:
a plurality of pixel rows disposed sequentially along a first direction in the display area, wherein each pixel row of the plurality of pixel rows comprises a plurality of pixel sets arranged along a second direction, wherein the second direction intersects the first direction; wherein each pixel set of the plurality of pixel sets comprises a first pixel and a second pixel arranged along the second direction; and
a plurality of high voltage signal lines extending along the first direction,
wherein the first pixel comprises a first sub-pixel, a second sub-pixel, and a third sub-pixel emitting different colors, and the second pixel comprises a fourth sub-pixel, a fifth sub-pixel, and a sixth sub-pixel emitting different colors;
wherein each of the first to sixth sub-pixels comprises a pixel driving circuit and an organic light-emitting diode;
wherein the plurality of high voltage signal lines is electrically connected to the first to sixth sub-pixels, so as to provide voltage signals to anodes of the organic light-emitting diodes of the first to sixth sub-pixels for driving said first to sixth sub-pixels to emit light, wherein the plurality of high voltage signal lines comprises a third high voltage signal line;
wherein the third sub-pixel and the fourth sub-pixel in a same said pixel set are electrically connected to a same said third high voltage signal line and emit a same color.

18. The organic light-emitting display device according to claim 17, wherein
the third sub-pixel and the fourth sub-pixel are mirror symmetrical to each other about said third high voltage signal line.

19. The organic light-emitting display device according to claim 17, wherein
the first pixel and the second pixel are mirror symmetrical to each other about said third high voltage signal line.

20. The organic light-emitting display device according to claim 17,
wherein the first sub-pixel and the second sub-pixel are arranged along the first direction, and wherein the third sub-pixel and a first sub-area where the first sub-pixel and the second sub-pixel are located are arranged along the second direction; and
wherein the fifth sub-pixel and the sixth sub-pixel are arranged along the first direction, and the fourth sub-pixel and a second sub-area where the fifth sub-pixel and the sixth sub-pixel are located are arranged along the second direction.

\* \* \* \* \*